(12) United States Patent
Van Antwerpen

(10) Patent No.: US 7,945,877 B1
(45) Date of Patent: May 17, 2011

(54) RECOGNIZING MULIPLEXERS

(75) Inventor: Babette Van Antwerpen, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 526 days.

(21) Appl. No.: 12/041,558

(22) Filed: Mar. 3, 2008

Related U.S. Application Data

(60) Provisional application No. 60/892,790, filed on Mar. 2, 2007.

(51) Int. Cl.
*G06F 17/50* (2006.01)
*G06F 9/455* (2006.01)

(52) U.S. Cl. .................... 716/104; 716/132; 716/135

(58) Field of Classification Search ............. 716/3, 18, 716/104, 132, 135
See application file for complete search history.

(56) References Cited

U.S. PATENT DOCUMENTS

| | | | | |
|---|---|---|---|---|
| 6,151,568 | A * | 11/2000 | Allen et al. ................. | 703/14 |
| 6,505,337 | B1 * | 1/2003 | Wittig et al. ................ | 716/17 |
| 6,519,755 | B1 * | 2/2003 | Anderson ................... | 716/18 |
| 6,526,563 | B1 * | 2/2003 | Baxter ....................... | 716/18 |
| 7,428,722 | B2 * | 9/2008 | Sunkavalli et al. ........ | 716/17 |
| 7,735,045 | B1 * | 6/2010 | Van Mau et al. ........... | 716/16 |
| 2008/0129334 | A1 * | 6/2008 | Sunkavalli et al. ........ | 326/38 |

* cited by examiner

*Primary Examiner* — Stacy A Whitmore
(74) *Attorney, Agent, or Firm* — Ropes & Gray LLP

(57) ABSTRACT

A chain of multiplexers disposed in a logic block is recognized as a selector and a group of logic gates disposed in the logic block and supplying signals to the select pins of the selector is recognized as a decoder, the selector and the decoder together define a n:1 multiplexer. To achieve this, a group of logic gates supplying signals to the select pins of the selector is identified within the logic block. A truth table defining the logic relationship between the signals applied to the group of logic gates and data signals received by the chain of muxes is generated. The chain of muxes is replaced with a selector upon determination that the rows in the truth table are disjoint. After replacing the chain of muxes with a selector, the process is repeated in a similar manner to replace the remaining logic blocks with a decoder.

31 Claims, 7 Drawing Sheets

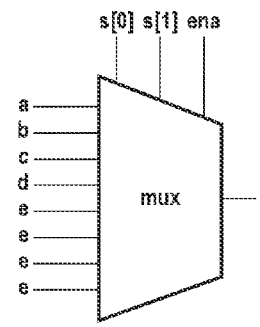
FIG. 12
FIG. 13
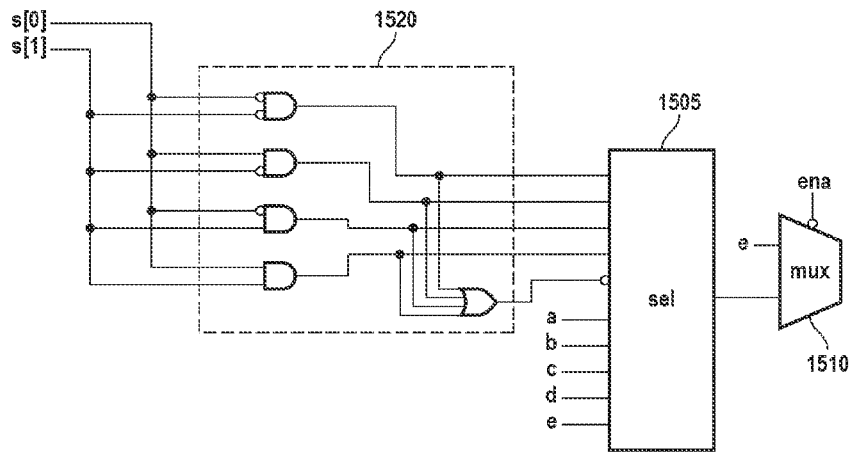
FIG. 14
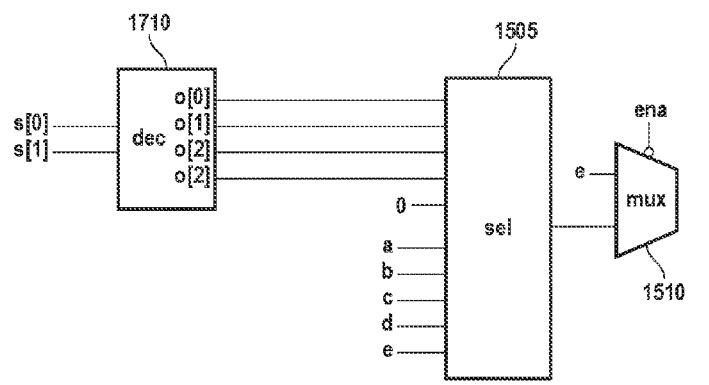
FIG. 15

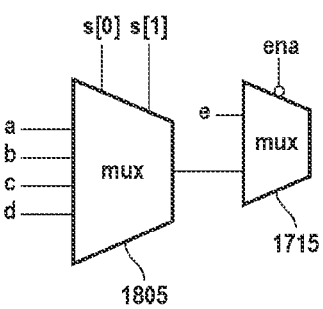
FIG. 16
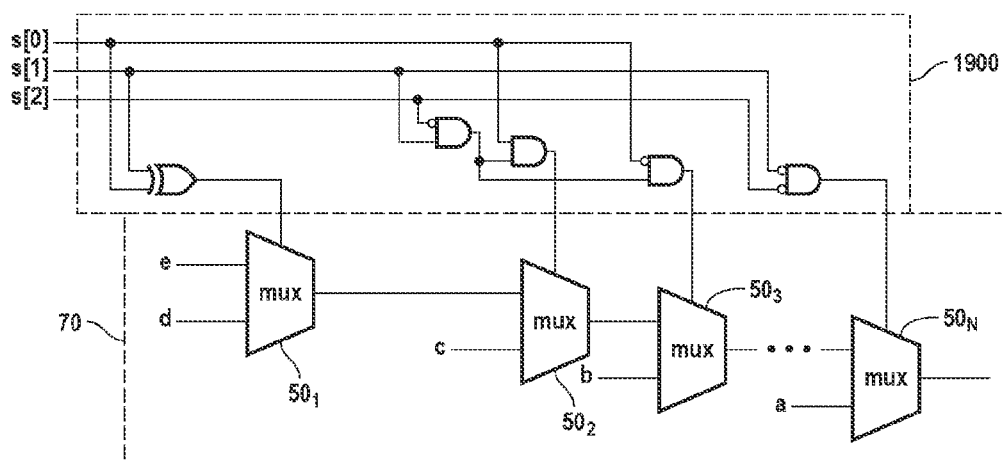
FIG. 17
| s[0] | 1 | 0 | 1 | 0 | 1 | 0 | 1 | 0 |
|---|---|---|---|---|---|---|---|---|
| s[1] | 1 | 1 | 0 | 0 | 1 | 1 | 0 | 0 |
| s[2] | 1 | 1 | 1 | 1 | 0 | 0 | 0 | 0 |
| a | 0 | 0 | 0 | 0 | 0 | 0 | 1 | 1 |
| b | 0 | 0 | 0 | 0 | 0 | 1 | 0 | 0 |
| c | 0 | 0 | 0 | 0 | 1 | 0 | 0 | 0 |
| d | 0 | 1 | 1 | 0 | 0 | 1 | 1 | 0 |
FIG. 18

RECOGNIZING MULIPLEXERS

CROSS-REFERENCES TO RELATED APPLICATIONS

The present application claims benefit under 35 USC 119 (e) of U.S. provisional Application No. 60/892,790, filed on Mar. 2, 2007, entitled "Recognizing Multiplexers", the content of which is incorporated herein by reference in its entirety.

BACKGROUND OF THE INVENTION

The present invention relates to integrated circuits, and more particularly to a method of identifying a multiplexer in a combinational logic.

Multiplexers and related logic are common types of combinational logic in digital circuits. FIGS. 1A, 1B and 1C respectively show a multiplexer 10, a selector 20 and a decoder 30. The binary multiplexer (mux) 10 is shown as having n data inputs (n>0) d[n−1 . . . 0] and m select inputs s[m−1 . . . 0], where $n=2^m$. A mux with n data inputs is also called an n:1 mux. The output O is set to d[i], where i is the decimal number represented by the binary number s[m−1 . . . 0]. So for n=4, O=s[0]'s[1]'d[0]+s[0]s[1]'d[1]+s[0]'s[1]d[2]+s[0]s[1]d[3], where notation "'" represent an inverse of a signal.

A selector, such as selector 20, has n data inputs d[n−1 . . . 0] and n select inputs s[n−1 . . . 0] (n>0). The select signals are one-hot, i.e., at any point in time only one of the select signals is at a high level 1. The output O is set to d[i] when s[i]=1. So for n=4, O=s[0]d[0]+s[1]d[1]+s[2]d[2]+s[3]d[3].

A decoder, such as decoder 30, has n inputs in[n−1 . . . 0] and m outputs o[m−1 . . . 0], where n>0, m>0, and $m=2^n$. For each i, O[i] is 1 if in[n−1 . . . 0] is the binary representation of decimal number i, and 0 otherwise. So for, e.g., n=4, O[0]=in[0]'in[1]', O[1]=in[0]in[1]', O[2]=in[0]'in[1], and O[3]=in[0]in[1].

One or more of the data signals received by selector 20 and mux 10 may be constant. The select signals applied to mux 10 and selector 20 and the input signals on the decoder 30 are assumed to be non-constant and unique. If this is not the case, the mux or selector can be reduced to a smaller size mux or selector that has only non-constant and unique select signals.

The output of a decoder may drive the select inputs of a selector providing the same functionality as a n:1 mux, where n is the data width of the decoder and the selector. The inputs of the decoder represent the select inputs of the mux, and the data inputs of the selector represent the data inputs of the mux. During synthesis of a logic code, written for example in VHDL or Verilog, these decoder-selector pairs are desired to replaced by an equivalent n:1 mux.

An HDL code for a mux may be written in a number of different ways. Tables I and II below are two different Verilog codes for a 16:1 mux. The code in Table II is usually used when the different data signals come from different variables, and not from one bus.

TABLE I

```
module mux_test(d,s,o);
input [NUM_DATA-1:0] d;
input [NUM_SEL-1:0] s;
output o;
reg o;
parameter NUM_DATA=16;
parameter NUM_SEL=4;
```

TABLE I-continued

```
always@(d or s)
begin
    o = d[s];
end
endmodule
```

TABLE II

```
module mux_test(d,s,o);
input [NUM_DATA-1:0] d;
input [NUM_SEL-1:0] s;
output o;
reg o;
parameter NUM_DATA=16;
parameter NUM_SEL=4;
always@(d or s)
begin
case (s)
    4'b0000 :
        o = d[0];
    4'b0001 :
        o = d[1];
    4'b0010 :
        o = d[2];
    4'b0011 :
        o = d[3];
    4'b0100 :
        o = d[4];
    4'b0101 :
        o = d[5];
    4'b0110 :
        o = d[6];
    4'b0111 :
        o = d[7];
    4'b1000 :
        o = d[8];
    4'b1001 :
        o = d[9];
    4'b1010 :
        o = d[10];
    4'b1011 :
        o = d[11];
    4'b1100 :
        o = d[12];
    4'b1101 :
        o = d[13];
    4'b1110 :
        o = d[14];
    4'b1111 :
        o = d[15];
endcase
end
endmodule
```

Another known Verilog code for a decoder driving a selector and specifying an n:1 mux is shown, in part, in Table III below. Each variable "deci" is an output of the decoder. The selector is defined by a sequence of "if . . . else if" statement, although the selector cannot be readily seen from this sequence. Extraction generates a chain of 2:1 muxes $40_1$, $40_2$ . . . $40_N$ for this code, as shown in FIG. 2.

TABLE III

```
module mux test(d,s,o);
input [NUM_DATA-1:0] d;
input [NUM_SEL-1:0] s;
output o;
reg o;
reg dec0;
...
reg dec15;
parameter NUM_DATA=16;
parameter NUM_SEL=4;
```

TABLE III-continued

```
always@(d or s)
begin
dec0=1'b0;
...
dec15=1'b0;
case (s)
    4'b0000 :
        dec0 = 1'b1;
    4'b0001 :
        dec1 = 1'b1;
    4'b0010 :
        dec2 = 1'b1;
    ...
    4'b1111 :
        dec15 = 1'b1;
endcase
if (dec0 == 1'b1)
    o = d[0];
else if (dec1 == 1'b1)
    o = d[1];
else if (dec2 == 1'b1)
    o = d[2];
else if (dec3 == 1'b1)
    o = d[3];
...
else if (dec14 == 1'b1)
    o = d[14];
else if (dec15 == 1'b1)
    o = d[15];
else
    o = 1'b0;
end
endmodule
```

From the decoder, it can be seen that the conditions in the "if . . . else if" chain are disjoint, i.e. they can never be high at the same time. Accordingly, the "if . . . else if" chain can be transformed into a selector. The decoder-selector pair can thus be replaced by an n:1 mux.

The process of transformation is more complicated if the decoder is not defined in a clear manner. For instance, in Table IV below, the decoder is only enabled when variable "ena" is true, thus posing difficulties for the extractor to recognize the decoder. This indicates that the select inputs of the chain of muxes $40_1$, $40_2$ . . . $40_N$ are driven by an arbitrary logic block 42, as shown in FIG. 3. It can be seen however, that the logic is equivalent to an n:1 mux 46 driving a 2:1 mux 48, as shown in FIG. 4. Even more challenging are conditions in which only a subset of select signals generate different data. This means that the different decoder outputs are lumped together, rendering the logic block even more arbitrary.

TABLE IV

```
module mux_test(d,s,o,ena);
input [NUM_DATA-1:0] d;
input [NUM_SEL-1:0] s;
input ena
output o;
reg o;
reg dec0;
...
reg dec15;
parameter NUM_DATA=16;
parameter NUM_SEL=4;
always@(d or s or ena)
begin
dec0=1'b0;
...
dec15=1'b0;
case (s)
    4'b0000 :
        dec0 = ena & 1'b1;
```

TABLE IV-continued

```
    4'b0001 :
        dec1 = ena & 1'b1;
    ...
    4'b1111 :
        dec15 = ena & 1'b1;
endcase
if (dec0 == 1'b1)
    o = d[0];
else if (dec1 == 1'b1)
    o = d[1];
else if (dec2 == 1'b1)
    o = d[2];
...
else if (dec15 == 1'b1)
    o = d[15];
else
    o = 1'b0;
end
endmodule
```

BRIEF SUMMARY OF THE INVENTION

In accordance with one embodiment of the present invention, a chain of multiplexers disposed in a logic block is recognized as and replaced with a selector, and a group of logic gates disposed in the logic block and supplying signals to the select pins of the selector is recognized as and replaced with a decoder, the selector and the decoder together define a n:1 multiplexer. In one embodiment, the chain of multiplexer is a chain of 2:1 multiplexers. In one embodiment, to achieve this, a group of logic gates supplying signals to the select pins of the selector is identified within the logic block. One or more muxes positioned at ends of the multiplexer may be eliminated to identify the group of logic gates in the logic block. A number of truth tables defining the logic relationship between signals received by the group of logic gates and the data signals received by the chain of muxes is generated. The chain of muxes is replaced with a selector upon determination that the rows in the truth table are disjoint. After replacing the chain of muxes with a selector, the process is repeated in a similar manner to replace the remaining logic blocks with a decoder.

In one embodiment, to accommodate an enabling/disabling signals, a 2:1 multiplexer is coupled to the output terminal of the selector. The enabling/disabling signal is applied to a first data terminal of the 2:1 multiplexer that receives the output signal of the selector at its second data terminal. The enabling/disabling signal is also applied to a data terminal of the selector configured not to be selected. One of the input signals received by the group of logic gates is applied to a select terminal of the 2:1 multiplexer. In one embodiment, the decoder has at least n output data signals.

BRIEF DESCRIPTION OF THE DRAWINGS

FIG. 12 shows the truth tables associated with the outputs of the group of logic gates of FIG. 11, in accordance with one embodiment of the present invention.

FIG. 13 shows an 8:1 multiplexer recognized from FIG. 11 and replacing the selector and the logic gates of FIG. 11, in accordance with one embodiment of the present invention.

FIG. 14 shows a selector supplying a signal to a data input terminal of a 2:1 mux and being controlled by a group of logic gates forming a cut identified in accordance with one embodiment of the present invention.

FIG. 15 shows a decoder, a selector and a multiplexer recognized as replacing a chain of multiplexers and a logic block receiving an enabling signal, in accordance with one embodiment of the present invention.

FIG. 16 shows the selector and the decoder of FIG. 15 being recognized as and transformed into a multiplexer, in accordance with one embodiment of the present invention.

FIG. 17 shows a logic block controlling the select terminals of a chain of multiplexers.

FIG. 18 shows the truth tables associated with the outputs of the logic block and the chain of multiplexers of FIG. 17, in accordance with one embodiment of the present invention.

DETAILED DESCRIPTION OF THE INVENTION

In accordance with one embodiment of the present invention, a chain of multiplexers and a logic block controlling the chain of multiplexers is recognized, transformed into and logically synthesized as an n:1 mux. The n:1 mux may drive other muxes. The following description is provided with respect to an algorithm for recognizing an n:1 multiplexer (mux). In accordance with this algorithm (i) a chain of muxes is recognized as a selector replaced by a selector; (ii) and a block of logic feeding the select signals of the selector is recognized as and replaced by a decoder. After completion of these steps, existing synthesis algorithms may be used to replace the decoder and selector pair by a mux.

Selector Recognition

Figure 1A:
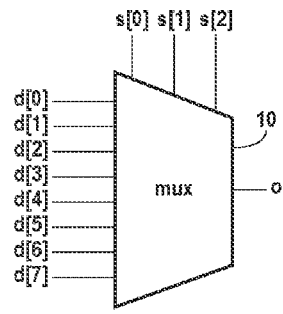
FIGS. 1A, 1B and 1C respectively show a multiplexer, a selector, and a decoder, as known in the prior art.
Figure 1B:
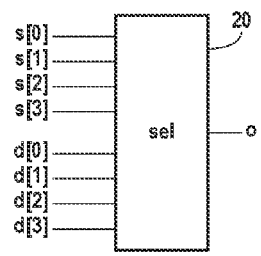
Figure 1C:
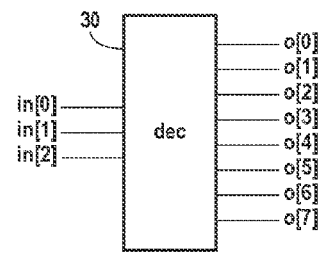
Figure 2:
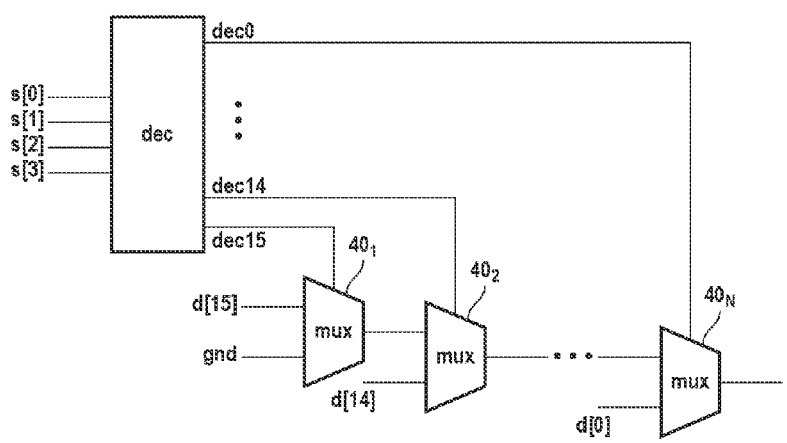
FIG. 2 shows a decoder controlling the select terminals of a chain of multiplexers.
Figure 3:
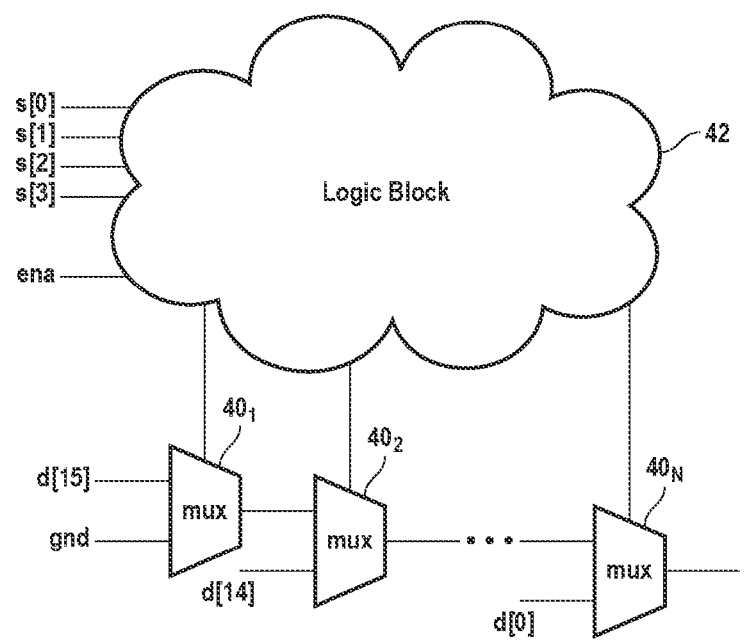
FIG. 3 shows a logic block controlling the select terminals of a chain of multiplexers.
Figure 4:
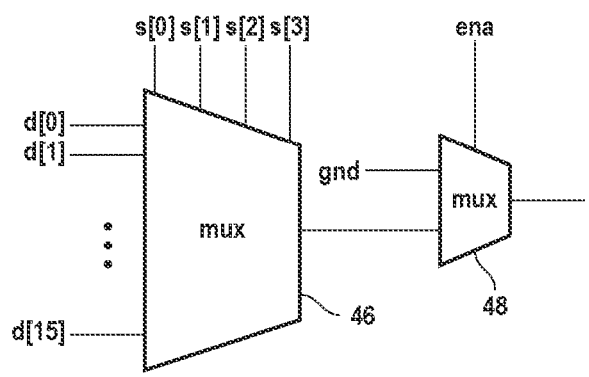
FIG. 4 shows a 16:1 multiplexer controlling a data terminal of a 2:1 multiplexer.
Figure 5:
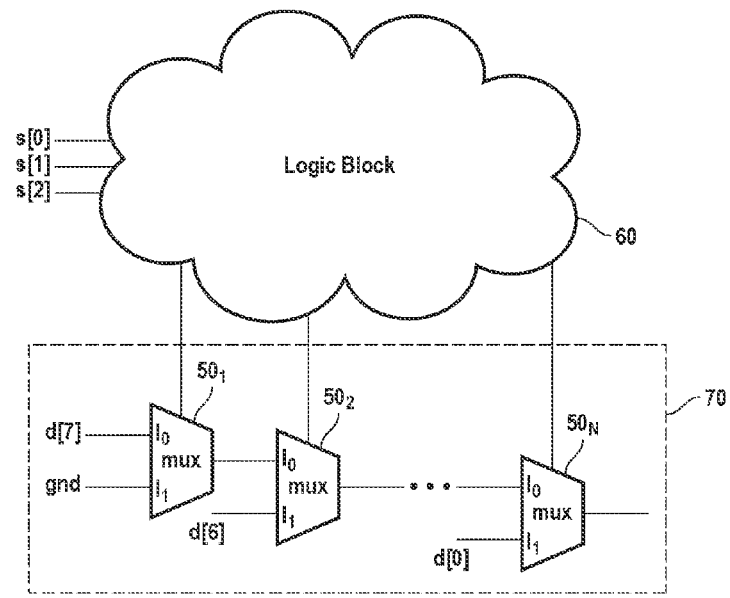
FIG. 5 shows a logic block controlling the select terminals of a chain of multiplexers.

Referring to FIG. 5, assume a chain 70 of 2:1 muxes $50_1$, $50_2 \ldots 50_N$ such that for each mux $50_i$ in the chain, where i is an index ranging from 1 to N and where N is 8 in this example, except the first mux (i.e., mux $50_1$ that is not driven by another mux), the data input $I_0$ (0-side) that is selected in response to a first (e.g., low) logic level of the select signal is fed by another mux in the chain, and the data input $I_1$ (1-side) that is selected in response to a second (e.g., high) logic level of the select signal, the 1-side, is fed by data. If this is not the case the chain of muxes can be transformed to correspond to this structure.

To determine whether the chain 70 of muxes is a selector, an identification is first made as to whether the select terminal for each of the 2:1 muxes is disjoint from the other select terminals. A select terminal for a mux is disjoint from the other select terminals if when the select terminal for that mux is in a selected (true) state, the select terminals of no other mux in the chain is true. Next, a cut defining a logic block that controls the select terminals of the 2:1 muxes is identified. Referring to FIG. 5, the cut is identified as including logic block 60 that receives signals s[0], s[1], s[2] and in response controls the select terminals of the 2:1 muxes shown in chain of muxes 70. Any one of a number of known algorithms may be used to find a relatively small cut with a relatively large volume. Such an algorithm is described in, for example, "Flows in Networks", authored by L. R. Ford, Jr. and D. R. Fulkerson, Princeton University Press, 1962; "Introduction to Algorithms" authored by T. H. Cormen, C. E. Leiserson and R. L. Rivest, second edition. MIT Press and McGraw-Hill, 2001.

Input signals received by a cut often come from output signals of other combinational logic and thus are difficult to identify. If the mux chain functions as a selector, it is likely that there is a relatively small cut to find. For instance an 128:1 mux has 7 select signals logically equivalent to a chain of 128 muxes. The select terminal of each of the 128 2:1 muxes would be a function of the 7 input signals applied to the cut. In other words, the select terminals of the muxes would be fed by a cone of logic that receives the 7 signals applied to the cut. In other words, the cut would receive 7 input signals.

If a cut is not found, attempt is made to find a portion of the mux chain for which a cut can be found. This is done by dropping muxes at both ends until a cut is found. If a cut is found that is small enough—it should at least be smaller than the number of muxes in the chain—and doesn't have more than, for example, 12 inputs, a truth table associated with the logic for each select signal expressed in terms of the inputs applied to the cut is generated.

Figure 6:
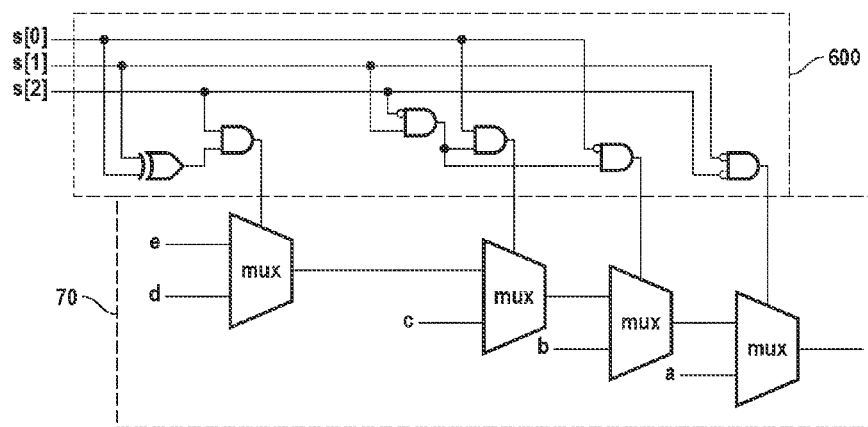
FIG. 6 shows a group of logic gates identified from the logic block of FIG. 5 as controlling the select terminals of the chain of multiplexers, in accordance with one embodiment of the present invention.
Figures 7, 8:
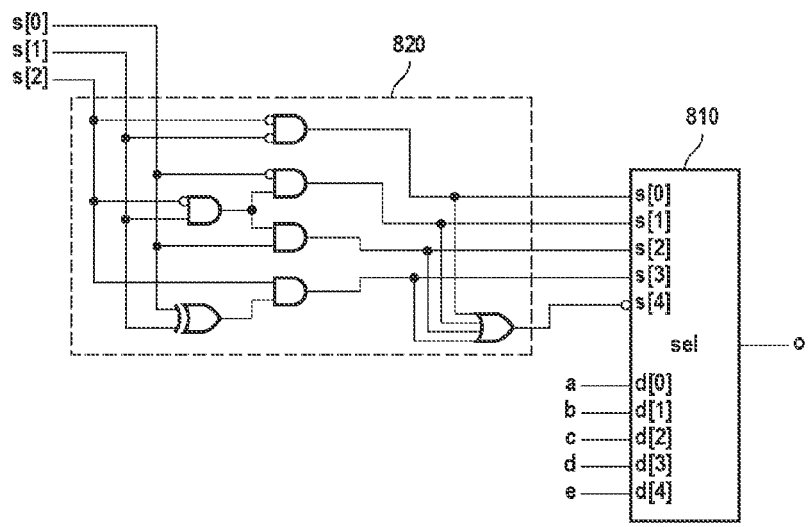
FIG. 7 shows the truth tables associated with the outputs of the group of logic gates and the chain of multiplexers of FIG. 6, in accordance with one embodiment of the present invention.
FIG. 8 shows the chain of multiplexers of FIG. 6 recognized as and transformed into a selector controlled by a group of logic gates, in accordance with one embodiment of the present invention.

An example design for FIG. 5 is shown in FIG. 6. The group of logic gates (logic group) 600 in FIG. 6 corresponds to the logic block 60 in FIG. 5. Logic group 600 is shown as having a cut consisting of input signals S[0], S[1], and S[2]. Each output of the logic group represents the logic that selects one of the data signals "a", "b", "c", and "d" ("e" is selected when none of the other ones are). FIG. 7 contains truth tables for the outputs of logic group 600 expressed in terms of the input signals S[0], S[1], and S[2]. Rows labeled "a", "b", "c" and "d" represent truth tables for the select logic that selects these data signals. The row labeled "e", representing this signal, is also shown but does not correspond to any of the outputs of the logic group. Pair wise comparisons of all the truth table 700 rows (entries) are performed by taking the AND of each pair of rows in the truth table. If the AND of two truth table rows is 0, then the two signals in those two rows are disjoint. As is seen from table 700, bit-wise AND operation of any of the two rows "a", "b", "c", and "d" results in zeroes, thus indicating that the truth table rows are disjoint.

As stated above, by comparing the pairs of entries in the truth table, it is determined whether all select signals are disjoint. If the truth table entries are disjoint, the chain of muxes is replaced by a selector. If there are n muxes in the chain, the selector will have a width of n+1. The first n select signals will be the select signals of the n muxes, from one end to another. The last select signal of the selector is set to the logical NOT of the logical OR of all the first n select signals, representing the remaining case if all the select signals are 0. The first n data signals on the selector will be the data signals feeding the 1-side of the n muxes. The last data signal will feed the 0-side of the last mux in the chain. FIG. 8 shows the selector 810 recognized as a result of the above algorithm and the logic block 820 that receives signals S[0], S[1], S[2] and drives the select signals of selector 810 in response.

Decoder Recognition

Figure 9:
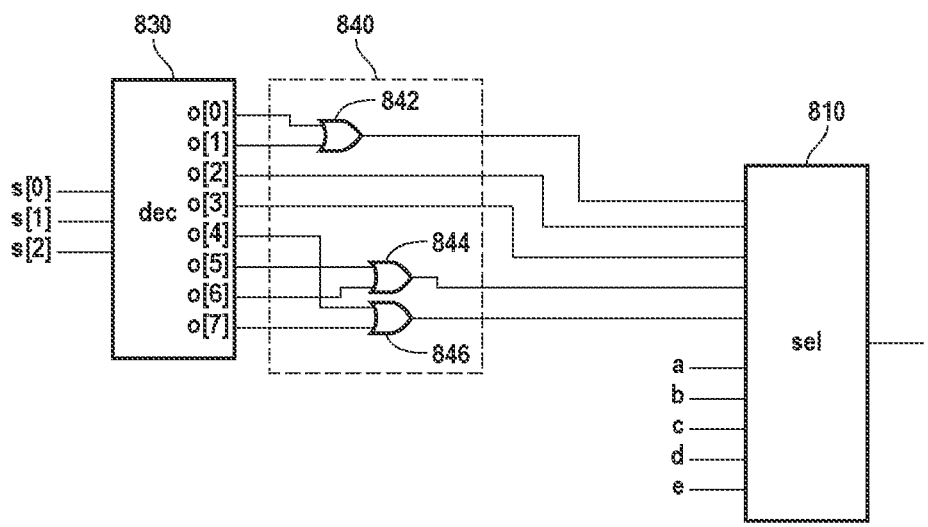
FIG. 9 shows the group of logic gates of FIG. 8 transformed, in part, into a decoder, in accordance with one embodiment of the present invention.
Figure 10:
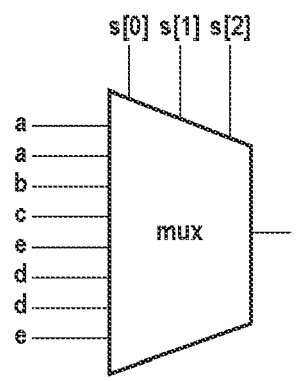
FIG. 10 shows the selector, decoder and the logic gates of FIG. 9 transformed into a multiplexer, in accordance with one embodiment of the present invention.

Assume that the selector recognized as described above has a width of n, and the logic block feeding (supplying signals to) the select signals of the selector is not itself fed by a decoder. Since the logic block is feeding the select signals, it is established that the logic cones (logic blocks defined by one output and multiple inputs) are disjoint, as described above. The same algorithm described above is used to find a small cut in the logic in which attempt is being made to recognize a decoder. If a small cut is found (e.g. size 10-12 or less), the logic block is transformed into a decoder where the inputs of the decoder are fed by the inputs to the cut. For each select cone, a truth table is generated to determine the function of the cone with each logic 1 in the truth table corresponding to an output of the decoder. The logic cone is the logical OR of all the outputs representing the decoder and represents the logic recognized as the decoder. FIG. 9 shows the decoder 830, the selector 810 and the logic 820 disposed therebetween obtained in accordance with the above algorithm for the truth table shown in FIG. 7 and the logic shown in FIG. 8. FIG. 10 shows an 8:1 mux recognized in accordance with the present invention and that represents selector 810, decoder 830 and the OR gates 842, 844 and 846 disposed in logic block 840 of FIG. 9.

Enable Signals

Figure 11:
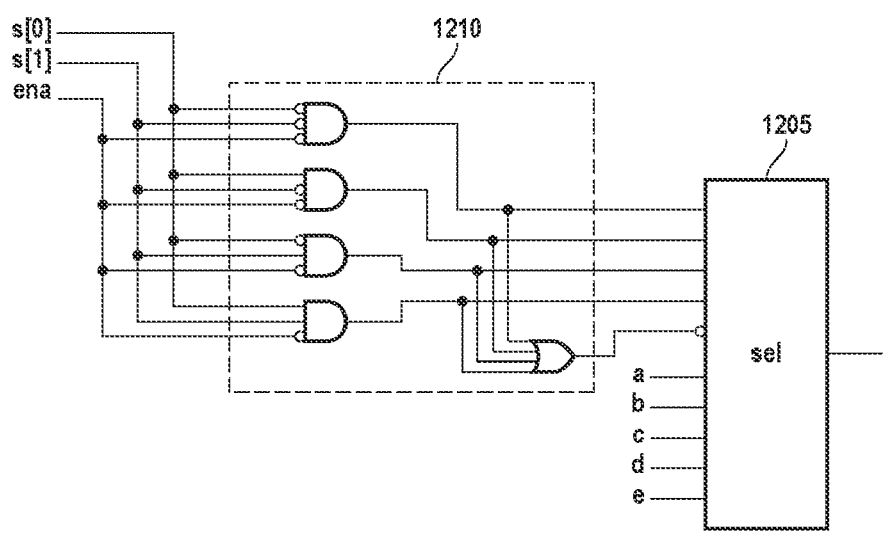
FIG. 11 shows a recognized selector controlled by a group of logic gates, in accordance with one embodiment of the present invention.

FIG. 11 is a block diagram of a selector 1205 driven by a group of logic gates 1210, where selector 1205 is recognized from a chain of four 2:1 multiplexers. Signals S[0], S[1], and "ena" are the input signals to logic block 1210 that represents the identified cut. FIG. 12 has truth tables for each of the outputs of the logic block 1210, based on the input signals S[0], S[1], and "ena". Rows labeled "a", b", "c", "d" and "e" correspond to the outputs of the logic that select that particular data signal. As is seen from the truth tables shown in FIG. 12, signal "e" is selected whenever signal "ena" is true. FIG. 13 shows an 8:1 mux generated from the truth table shown in FIG. 12 and in accordance with the algorithm for recognizing decoders and muxes. This implementation is inefficient because "e" represents half of the data signals on the mux. A more efficient implementation is shown in FIG. 16. In general, for each enable signal like "ena" described above, the size of the mux doubles. So if, for example, the process begins with a large mux and 2 or more enable signals exist, a mux that is 4 times larger would result. To avoid this problem, the following algorithm is performed in accordance with the present invention.

In accordance with such an algorithm, the data signal that is selected when the "ena" signal is off is applied to a data input pin of a 2:1 mux driven by the selector; the "ena" signal itself is applied to the select input pin of this mux. Reference is made to the example shown in FIG. 14 to describe this algorithm for treating the enabling signal. FIG. 14 shows a selector 1505, a 2:1 mux 1510 and a group of logic gates 1520 recognized in accordance with the present invention for treating a chain of muxes and after recognizing the selector. As is seen from FIG. 14, signal "e" is applied to a data input pin of 2:1 mux 1510, and signal NOT "ena" is applied to the select input pin of this mux. It is straightforward to find out from the truth tables in FIG. 12 that every select pin on the selector in FIG. 11 except one represents the AND of the NOT of the "ena" signal with a function of the rest of the select signals. This means that when the "ena" signal is true, only one data signal can be selected, in FIG. 11 this is data signal "e". This information is used to pull the "ena" signal out to the head of the selector into a 2:1 mux (1510 in FIG. 14). The logic 1210 feeding into selector 1205 in FIG. 11 can now be modified by replacing the "ena" signal by the value true, resulting in the logic block 1520 in FIG. 14. In the selector 1505, the signal selecting the "e" signal is set to the ground potential because signal "e" is not selected when "ena" is false, as can be seen from the truth tables in FIG. 12. In other words, during recognition of the decoders feeding the selector, attempt is made to identify every select input that acts as an enable signal. Every identified enable signal is extracted from the selector and select logic by placing a 2:1 mux at the head of the selector, i.e., the selector that feeds the 2:1 mux. Tests are performed to determine the conditions where the enable is true and to remove the enable from the set of select inputs. A more detailed description of this process is provided below.

Referring to FIG. 11, assume signals S[0], S[1], and "ena" represent all the input signals (cut) to logic block 1210. For each of the select input pins of selector 1505, a truth table is generated for the output signals of the logic group in the same manner as described above with respect to the decoder recognition. FIG. 12 shows the truth tables for the outputs of logic group 1210 in FIG. 11. To extract the enable inputs, the following is performed for each input signal S. For each entry in the truth table, a determination is made as to whether the truth table's function is either the AND of input signal S and a function independent of S, or the OR of NOT S and a function independent of S. If it is found that exactly one truth table's function is the OR of NOT S and a function independent of S, and all others are the AND of S and a function independent of S, then S acts as an enable. Applying this algorithm to the logic block shown in FIG. 11 results in the identification of select input pin NOT "ena" as an enable signal.

Referring to FIGS. 11 and 14 and assuming that signal NOT "ena" is identified as an enable pin in FIG. 11, 2:1 mux 1510 is placed at the output of the selector 1505 in FIG. 14. Signal NOT "ena" is the select input of 2:1 mux 1510. The data-0 port of mux 1510 is connected to "e" (or in general, to the data port on the selector that is associated with the select whose function is the OR of NOT the enable signal and a function independent of the enable signal). The data-1 port of mux 1510 is connected to the output selector. The presence of the 2:1 mux at the head of the selector guarantees that the value of the selector is only visible when the "ena" signal is false (or in general, when the enable signal is true). Therefore "ena" can be replaced by false everywhere in logic group 1210 of FIG. 11, resulting in logic group 1520 of FIG. 14. After this process is repeated for each select input and the inverse of each select input, the decoder is created as described above, from the modified truth tables and reduced set of select inputs. For each select input that is extracted this way, the decoder will have one less input, and the output size will be reduced in half. FIG. 15 shows the logic blocks shown in FIG. 14 where the logic group 1520 is replaced by a decoder. FIG. 16 shows how FIG. 15 is recognized as a 4:1 mux 1805 driving a 2:1 mux 1715.

Non-Disjoint Select Signals

FIG. 17 is a block diagram of a chain of muxes 70 and a cut identified as including logic block 1900 and input signals S[0], S[1], and S[2]. As is seen, the select logic on mux $50_1$ is defined by {s[0] XOR s[1]}. FIG. 18 is a truth table associated with the logic blocks shown in FIG. 17. Rows labeled "a", "b", "c", "d" represent truth table entries for the select logic that selects these data signals. Bit-wise AND of row "d" with "a", "b" or "c" does not give all-zeroes. In other words, the select logic for "d" is not disjoint with the select logic for signals "a", "b" and "c". However, the select logic for "d" may be changed to make it disjoint with the other signals without changing the functionality of the chain of muxes. This corresponds to modifying signal "d's" truth table by zero-ing out all 1's that are 1 in any of rows "a", "b" and "c", i.e., bitwise and of row "d" with not the bit-wise or of rows "a", "b", and "c". Accordingly, in such conditions, the intermediate step of replacing the chain of muxes with a selector is not performed. Instead, the process moves directly to the selector-decoder identification as described above. Since the logic cones feeding the select logic on any chain of muxes can be made disjoint, attention must be paid to do this only when it is beneficial for quality of results. For example, one must make sure that the size of the cut is smaller than the number of muxes in the chain. In the example shown in FIG. 17, it is assumed that only signal "d" is not disjoint with the select logic for signals "a", "b" and "c". It is understood, however, that the present invention applies regardless of the number of signals that may be disjoint with respect to one another. For example, two or more signals may be disjoint with the remaining select signals.

Finding a Small Cut with High Volume

The algorithm used above to find a small cut with high volume is based on the famous max-flow min-cut algorithm described in "Flows in Networks", by L. R. Ford, Jr. and D. R. Fulkerson, Princeton University Press, 1962; or "Introduction to Algorithms", by T. H. Cormen, C. E. Leiserson and R. L. Rivest, Second Edition. MIT Press and McGraw-Hill, 2001. This algorithm works on a given graph with sources and sinks and finds a smallest set of edges in the graph such that any path from the sources to the sinks goes through at least one edge in the cut (in other words all paths from source to sinks are cut by these edges).

This algorithm is used iteratively to find a cut for which the number of nodes connected to the sinks of the graph is as large as possible and doesn't have large size. The algorithm first finds a set of cuts with limited size. From this set, it selects the cut with highest volume, as described by the following pseudo-code:

```
find_cuts (graph, max_size, cutset)
{
    Find min cut using Ford-Fulkerson algorithm
    If cut size <=max_size
    {
        Add cut to cutset
        For each edge in the cut
        {
            Modify the graph such that this edge has infinite capacity (meaning it won't be in any min cut)
            Recursively call find_cuts on the modified graph
        }
    }
}
```

One embodiment of the present invention includes software modules that provide instructions executed by a central processing unit. Another embodiment of the present invention includes dedicated hardware modules. Another embodiment of the present invention includes both software and hardware modules.

The above embodiments of the present invention are illustrative and not limiting. Various alternatives and equivalents are possible. Other additions, subtractions or modifications are obvious in view of the present disclosure and are intended to fall within the scope of the appended claims.

What is claimed is:

1. A computer-implemented method of defining a first multiplexer during a logic synthesis, the computer-implemented method comprising:
    transforming, using a processor, a plurality of multiplexers disposed in a logic block into a selector;
    transforming a plurality of logic gates disposed in the logic block into a decoder, wherein the decoder is operable to supply signals to select pins of the selector; and
    transforming the selector and the decoder into the first multiplexer.

2. The computer-implemented method of claim 1 wherein the plurality of multiplexers comprises a chain of multiplexers.

3. The computer-implemented method of claim 2 further comprising:
    determining whether select terminals of the chain of multiplexers are disjoint from one another.

4. The computer-implemented method of claim 2 further comprising:
    eliminating one or more multiplexers positioned at ends of the multiplexer chain to identify the plurality of logic gates in the logic block.

5. The computer-implemented method of claim 3 further comprising:
    modifying a truth table associated with a select terminal of a first multiplexer of the chain of multiplexers if the first multiplexer is not disjoint from select terminals of other multiplexers of the chain of multiplexers, the modification causing the select terminal of the first multiplexer to be disjoint from the select terminals of the other multiplexers of the chain of multiplexers without changing the functionality of the chain of multiplexers.

6. The computer-implemented method of claim 1 wherein one of a plurality of select signal paths coupled to the selector comprises a logic NOT gate coupled to a logic OR gate, wherein the logic OR gate is coupled to other select signal paths of the plurality of select signal paths coupled to the selector.

7. The computer-implemented method of claim 1 wherein the decoder is operable to receive input signals received by the plurality of logic gates, and wherein the decoder is further operable to supply output signals to the selector.

8. The computer-implemented method of claim 1 wherein an enabling signal is coupled to a select terminal of a second multiplexer, and wherein the second multiplexer is operable to receive an output signal of first multiplexer at a first data terminal of the second multiplexer and to receive an input signal received by the plurality of logic gates at a second data terminal of the second multiplexer.

9. The computer-implemented method of claim 1 wherein the first multiplexer is an n:1 multiplexer, and wherein the decoder has at least n output signals.

10. The computer-implemented method of claim 1 further comprising:
    generating truth tables defining a relationship between input signals received by the plurality of logic gates and input signals received by the plurality of multiplexers.

11. The computer-implemented method of claim 10 further comprising:
    identifying at least one of the input signals received by the plurality of logic gates as an enabling signal if a first truth table of the generated truth tables is defined by a logic OR operation of the inverse of at least one of the input signals received by the plurality of logic gates and a signal independent of the inverse of the at least one of the input signals received by the plurality of logic gates, and other truth tables of the generated truth tables are defined by a logic AND operation of the at least one of the input signals received by the plurality of logic gates and an input signal associated with the first truth table.

12. A non-transitory computer readable storage medium including instructions for performing logic synthesis on a logic function, said instructions being operative to perform operations comprising:
transforming a plurality of multiplexers defined by the logic function into a selector;
transforming a plurality of logic gates defined by the logic function into a decoder, wherein the decoder is operable to supply signals to select pins of the selector; and
transforming the selector and the decoder into a first multiplexer.

13. The computer readable storage medium of claim 12 wherein the plurality of multiplexers is a chain of multiplexers.

14. The compute readable storage medium of claim 13 wherein said instructions are further operative to perform operations comprising:
determining whether select terminals of the chain of multiplexers are disjoint from one another.

15. The computer-implemented method of claim 14 further comprising:
modifying a truth table associated with a select terminal of a first multiplexer of the chain of multiplexers if the first multiplexer of the chain of multiplexers is not disjoint from select terminals of other multiplexers of the chain of multiplexers, the modification causing the select terminal of the first multiplexer of the chain of multiplexers to be disjoint from the select terminals of the other multiplexers of the chain of multiplexers without changing the functionality of the chain of multiplexers.

16. The computer readable storage medium of claim 13 wherein said instructions are further operative to perform operations comprising:
eliminating one or more multiplexers positioned at ends of the multiplexer chain to identify the plurality of logic gates in the logic function.

17. The computer readable storage medium of claim 12 wherein one of a plurality of select signal paths coupled to the selector includes a logic NOT gate coupled to a logic OR gate, wherein the logic OR gate is coupled to other select signal paths of the plurality of select signal paths coupled to the selector.

18. The computer readable storage medium of claim 12 wherein the decoder is operable to receive input signals received by the plurality of logic gates, and wherein the decoder is further operable to supply output signals to the selector.

19. The computer readable storage medium of claim 12 wherein an enabling signal is coupled to a select terminal of a second multiplexer, wherein the second multiplexer is operable to receive an output signal of the first multiplexer at a first data terminal of the second multiplexer, and to receive an input signal received by the plurality of logic gates at a second data terminal of the second multiplexer.

20. The computer readable storage medium of claim 12 wherein the first multiplexer is an n:1 multiplexer, and wherein the decoder has at least n output signals.

21. The computer readable storage medium of claim 12 wherein said instructions are further operative to perform operations comprising:
generating truth tables defining a relationship between input signals received by the plurality of logic gates and input signals received by the plurality of multiplexers.

22. The computer readable storage medium of claim 21 wherein said instructions are further operative to perform operations comprising:
identifying at least one of the input signals received by the plurality of logic gates as an enabling signal if a first truth table of the generated truth tables is defined by a logic OR operation of the inverse of the at least one of the input signals received by the plurality of logic gates and a signal independent of the inverse of the at least one of the input signals received by the plurality of logic gates, and other truth tables of the generated truth tables are defined by a logic AND operation of the at least one of the input signals received by the plurality of logic gates and an input signal associated with the first truth table.

23. A system adapted to define a single multiplexer during a logic synthesis, the system comprising:
a first hardware module adapted to transform a plurality of multiplexers disposed in a logic block into a selector;
a second module adapted to transform a plurality of logic gates disposed in the logic block into a decoder, wherein the decoder is operable to supply signals to select pins of the selector; and
a third module adapted to transform the selector and the decoder into the single multiplexer.

24. The system of claim 23 wherein the plurality of multiplexers comprises a chain of multiplexers.

25. The system of claim 24 further comprising:
a fourth module adapted to determine whether select terminals of the chain of multiplexers are disjoint from one another.

26. The system of claim 25 wherein said second, third, and fourth modules are software modules.

27. The system of claim 25 wherein said second, third, and fourth modules are hardware modules.

28. The system of claim 25 wherein said first, second, third, and fourth modules include software and hardware modules.

29. The system of claim 24 further comprising:
a fifth module adapted to eliminate one or more multiplexers positioned at ends of the multiplexer chain to identify the plurality of logic gates in the logic block.

30. The system of claim 23
wherein one of a plurality of select signals of paths coupled to the selector comprises a logic NOT gate coupled to a logic OR gate, wherein the logic OR gate is coupled to other select signal paths of the plurality of select signal paths coupled to the selector.

31. The system of claim 23 wherein the decoder is operable to receive input signals received by the plurality of logic gates, and wherein the decoder is further operable to supply output signals to the selector.

* * * * *

UNITED STATES PATENT AND TRADEMARK OFFICE
CERTIFICATE OF CORRECTION

PATENT NO. : 7,945,877 B1  
APPLICATION NO. : 12/041558  
DATED : May 17, 2011  
INVENTOR(S) : Babette Van Antwerpen It is certified that error appears in the above-identified patent and that said Letters Patent is hereby corrected as shown below:

Title Page, Item (54) and at Column 1, line 1, Title:

Change "RECOGNIZING MULIPLEXERS" to -- RECOGNIZING MULTIPLEXERS --

Signed and Sealed this
Fourth Day of October, 2011

David J. Kappos
*Director of the United States Patent and Trademark Office*